(12) United States Patent
Oh et al.

(10) Patent No.: US 11,401,427 B2
(45) Date of Patent: Aug. 2, 2022

(54) CONDUCTIVE PAINT COMPOSITION

(71) Applicants: Hyeon Cheol Oh, Incheon (KR); dong il Kim, Seoul (KR)

(72) Inventors: Hyeon Cheol Oh, Incheon (KR); dong il Kim, Seoul (KR)

( * ) Notice: Subject to any disclaimer, the term of this patent is extended or adjusted under 35 U.S.C. 154(b) by 0 days.

(21) Appl. No.: 16/816,622

(22) Filed: Mar. 12, 2020

(65) Prior Publication Data
US 2020/0308423 A1 Oct. 1, 2020

(30) Foreign Application Priority Data

Mar. 29, 2019 (KR) .......................... 10-2019-0036634

(51) Int. Cl.
| | | |
|---|---|---|
| C09D 5/24 | (2006.01) | |
| C09D 7/40 | (2018.01) | |
| C09D 7/62 | (2018.01) | |
| C09D 133/00 | (2006.01) | |
| C09D 163/00 | (2006.01) | |
| C09D 175/04 | (2006.01) | |
| H05K 9/00 | (2006.01) | |
| C09D 1/00 | (2006.01) | |
| C09D 5/44 | (2006.01) | |
| C09D 7/61 | (2018.01) | |
| C09D 7/20 | (2018.01) | |

(52) U.S. Cl.
CPC ................. *C09D 5/24* (2013.01); *C09D 1/00* (2013.01); *C09D 5/448* (2013.01); *C09D 5/4457* (2013.01); *C09D 7/20* (2018.01); *C09D 7/40* (2018.01); *C09D 7/61* (2018.01); *C09D 7/62* (2018.01); *C09D 7/68* (2018.01); *C09D 7/69* (2018.01); *C09D 133/00* (2013.01); *C09D 163/00* (2013.01); *C09D 175/04* (2013.01); *H05K 9/0092* (2013.01); *C08K 2201/003* (2013.01)

(58) Field of Classification Search
None
See application file for complete search history.

(56) References Cited

U.S. PATENT DOCUMENTS 5,489,449 A * 2/1996 Umeya ...................... B01J 8/42
427/213
6,159,602 A * 12/2000 Kadokura .............. C25D 13/00
204/496
(Continued)

FOREIGN PATENT DOCUMENTS

JP 3082864 B2 8/2000
JP 2005225947 A * 8/2005
(Continued)

OTHER PUBLICATIONS

English translation PDF of Fukuyama et al. (JP 2005-225947 A), accessed online from Espacenet; PDF copy attached having pp. 1-21. (Year: 2005).*

*Primary Examiner* — Katie L. Hammer
(74) *Attorney, Agent, or Firm* — KORUS Patent, LLC; Seong Il Jeong

(57) ABSTRACT

Disclosed herein is conductive paint for electro-deposition painting. The conductive paint includes non-oxide ceramic particles each configured such that an oxide layer is provided on a surface thereof. In this case, the non-oxide ceramic particles include at least one type of AxBy-form particles, where the sum of x and y is 7 or less.

9 Claims, 8 Drawing Sheets

(56) References Cited

U.S. PATENT DOCUMENTS

| | | | | |
|---|---|---|---|---|
| 6,582,763 B1* | 6/2003 | Nishimura | ............... | B22F 1/02 |
| | | | | 427/216 |
| 2004/0105980 A1* | 6/2004 | Sudarshan | .............. | H01F 1/447 |
| | | | | 428/404 |
| 2004/0121073 A1* | 6/2004 | George | ................. | B01J 23/755 |
| | | | | 427/215 |
| 2015/0307980 A1* | 10/2015 | Espallargas | ........... | C04B 35/584 |
| | | | | 427/450 |

FOREIGN PATENT DOCUMENTS

| | | |
|---|---|---|
| JP | 2006-265658 A | 10/2006 |
| JP | 2012-036314 A | 2/2012 |
| JP | 2012-036315 A | 2/2012 |
| JP | 2013-214567 A | 10/2013 |
| KR | 10-2016-0045378 A | 4/2016 |

\* cited by examiner

CONDUCTIVE PAINT COMPOSITION

CROSS-REFERENCE TO RELATED APPLICATION

This application claims the benefit of Korean Patent Application No. 10-2019-0036634 filed on Mar. 29, 2019, which is hereby incorporated by reference herein in its entirety.

BACKGROUND

1. Technical Field

The present invention relates to a physically and chemically stable conductive paint composition.

2. Description of the Related Art

With reductions in the size of electrical components, the importance of composite materials for electromagnetic shielding/absorption has been highlighted.

Electromagnetic shielding is a method of protecting internal electrical equipment by enclosing the surfaces thereof with a metal or the like and reflecting electromagnetic waves from the surface of the metal or allowing electromagnetic waves to flow along the surface of the metal and be discharged to the outside. Electromagnetic absorption is a method of converting electromagnetic waves into heat inside an absorber using a magnetic material and then losing them. These technologies are used in various industrial fields such as the defense industry and home appliance fields.

Generally, metals and metal coupling parts, such as connectors/adapters for communication used in the defense industry, home appliances, electronic devices, etc., are made of a combination of metal parts such as aluminum or iron. In this case, the metals and the metal coupling parts may be used in various fields such as the automotive industry, as well as the defense industry, home appliances, and electronic devices. Surface painting is necessary to prevent the oxidation of these metals and to implement characteristics using color. In this case, when electric charges are not conducted through the coupling part of metal parts, the movement/flow of electromagnetic waves between the metal parts becomes impossible, and thus noise is generated in internal electrical equipment. Painting methods that are used to manufacture products having uniform quality in large quantities include electro-deposition painting and electrostatic painting. The painting layers formed by these painting methods are insulators, and are problematic in that charges are not smoothly conducted through a coupling part between metal parts, i.e., a portion where a painting layer and a painting layer come into contact with each other.

Conventional conductive paints are products each using a highly conductive metal as a conductive filler. However, these products are very expensive, difficult to manufacture, store and process, and difficult to apply to a mass production process, such as an electrodeposition painting process or an electrostatic painting process. Accordingly, products requiring electrical conduction between painted metal parts, particularly communication connectors/adapters for electromagnetic shielding, are produced using cadmium plating, which is a material regulated under RoHS.

SUMMARY

An object of the present invention is to provide a physically and chemically stable conductive paint composition.

The objects of the present invention are not limited to the above-described object, and other objects that are not described herein will become apparent to those having ordinary skill in the art to which the present invention pertains from the present specification and the accompanying drawings.

According to one aspect, there is provided conductive paint for electro-deposition painting, the paint including non-oxide ceramic particles each configured such that an oxide layer is provided on a surface thereof. In this case, the non-oxide ceramic particles include at least one type of AxBy-form particles, where the sum of x and y is 7 or less.

The solutions to the object of the present invention are not limited to the above-described solution, and other solutions that are not described herein will become apparent to those having ordinary skill in the art to which the present invention pertains from the present specification and the accompanying drawings.

BRIEF DESCRIPTION OF THE DRAWINGS

The above and other objects, features, and advantages of the present invention will be more clearly understood from the following detailed description taken in conjunction with the accompanying drawings, in which.

DETAILED DESCRIPTION

Figure 1:
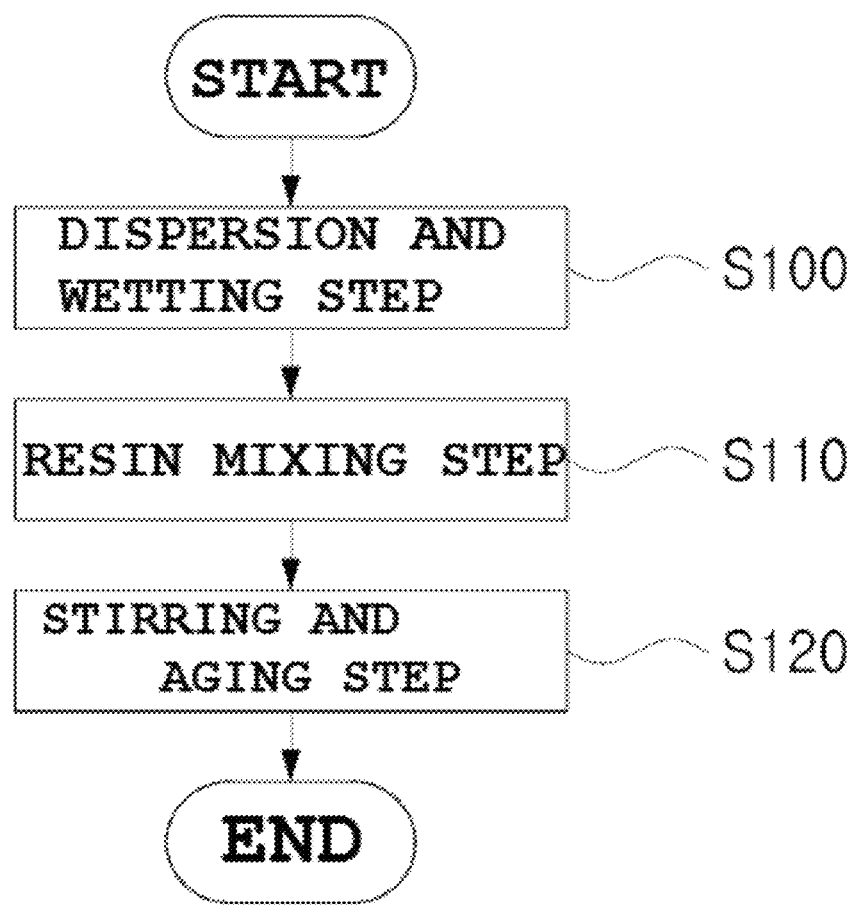
FIG. 1 is a flowchart showing a method of producing a conductive paint composition according to one embodiment.

The above-described object, features and advantages of the present invention will be more apparent from the following detailed description taken in conjunction with the accompanying drawings. Although the present invention may be subjected to various alterations and have various embodiments, specific embodiments will be illustrated in the accompanying drawings and described in detail below.

Throughout the drawings, the thicknesses of layers and regions are exaggerated for the sake of clarity. Furthermore, when a component or layer is described as being disposed "on" or "above" another component or layer, this includes both the case where the former component or layer is disposed immediately on or above the latter component or layer and the case where the former component or layer is disposed on or above the latter component or layer with a third component or layer disposed therebetween. Throughout the specification, like reference symbols designate like components. Furthermore, components having the same functions within the scope of the same spirit shown in the drawings of individual embodiments will be described using the same reference symbols.

When it is determined that a detailed description of a well-known function or configuration related to the present invention may unnecessarily obscure the gist of the present invention, the detailed description will be omitted. Furthermore, numbers (e.g., first, second, etc.) used in the description of the present specification are merely identification symbols that are each used to distinguish one component from another component.

Furthermore, the suffixes "module" and "unit" for components used in the following description are allocated or used for ease of the construction of the specification, and do not have meanings or roles distinguished from each other in themselves.

According to one aspect, a conductive paint for electro-deposition painting may include non-oxide ceramic particles each configured such that an oxide layer is provided on the surface thereof. In this case, the non-oxide ceramic particles may include at least one type of AxBy-form particles, where the sum of x and y may be 7 or less. For example, the non-oxide ceramic particles may include at least one of SiC, TiC and $Si_3N_4$ particles. It will be apparent that the non-oxide ceramic particles may include particles other than SiC, TiC and $Si_3N_4$ particles.

Furthermore, the conductive paint for electro-deposition painting may further include oxide ceramic particles.

Furthermore, in one embodiment, the thickness of the oxide layer may range from 0.1 to 50 nm.

Furthermore, in one embodiment, the diameter of the non-oxide ceramic particles may range from 100 to 10,000 nm.

Furthermore, in one embodiment, the conductive paint for electro-deposition painting may further include a resin and deionized water (DI water).

Furthermore, in one embodiment, the resin may include at least one of epoxy, acrylic and urethane resins.

Furthermore, in one embodiment, the non-oxide ceramic particles may be provided in the range of 2 to 25 wt %, the resin may be provided in the range of 10 to 40%, and the deionized water may be provided in the range of 50 to 88%.

Furthermore, in one embodiment, the non-oxide ceramic particles may be provided in the range of 7 to 17 wt %, the resin may be provided in the range of 15 to 30%, and the deionized water may be provided in the range of 55 to 75%.

Furthermore, in one embodiment, pH of the conductive paint for electro-deposition painting may range from 5.5 to 6.5.

Furthermore, in one embodiment, the oxide ceramic particles may be provided in an amount of 0 to 100% by weight relative to the non-oxide ceramic particles.

Furthermore, in one embodiment, the conductive paint for electro-deposition painting may further include a pigment for the implementation of color.

Furthermore, in one embodiment, the conductive paint for electro-deposition painting may further include a dispersant to improve dispersion characteristics.

Furthermore, in one embodiment, the ratio between the conductive paint for electro-deposition painting and the deionized water may be set such that the conductivity of the conductive paint for electro-deposition painting is 800-2300 µS/cm.

According to another aspect, there is provided a method of producing a conductive paint for electro-deposition painting including non-oxide ceramic particles and oxide ceramic particles, the method including: the step of dispersing and wetting the non-oxide ceramic particles and the oxide ceramic particles in deionized water to form a primary mixture; the step of mixing a resin with the primary mixture to form a secondary mixture; and the step of aging the secondary mixture by stirring the secondary mixture at room temperature.

Furthermore, in one embodiment, the step of dispersing and wetting may be the step of performing dispersion by providing a low frequency of 20 to 100 kHz.

According to one embodiment, the conductive paint composition may include conductive non-oxide ceramic particles each configured such that the surface thereof is oxidized, a binder resin, and a pigment.

In the conductive paint composition according to one embodiment, the conductive non-oxide ceramic particles that are oxidized may be one selected from the group consisting of transition metals and ceramic particles composed of C, B, N and Si and mixtures of two or more thereof.

Furthermore, the conductive paint composition according to one embodiment is not limited to the above-described materials, but various materials that are commonly used as conductive non-oxide ceramic particles that are oxidized may be used.

The oxidation of the non-oxide particles may be performed by natural oxidation in the air and a drying furnace oxidation method at a temperature of 400° C. or lower, but is not limited thereto. Commonly used non-oxide particle oxidation methods may be selectively used.

As an example, a method of performing forced oxidation at high temperature may be performed to form suboxides and oxycarbide on the surfaces of the non-oxide ceramic particles.

As a more specific example, suboxides and oxycarbide may be formed on the surfaces of the non-oxide ceramic particles by performing forced oxidation at a temperature of 700° C. or lower at which suboxides and oxycarbide are completely oxidized.

The oxidation of the non-oxide ceramic particles according to one embodiment is performed by three steps in a dry environment.

According to the present embodiment, the oxidation of the non-oxide ceramic particles may be achieved by an oxygen interstitial vacancy step, a suboxide formation step, and a crystalline oxide layer formation step.

Furthermore, according to one embodiment, the oxidation of the non-oxide ceramic particles may be performed in a wet environment. The oxidation of the non-oxide ceramic particles in a wet environment may be performed by an oxygen interstitial vacancies step, a suboxide formation step, and a crystalline oxide layer formation step that are performed almost simultaneously.

For example, in the case of TiC, oxidation in a dry environment may be sequentially performed in the form of oxycarbide à titanium suboxides (à titanium dioxide (anatase)) based on the TiC interstitial vacancies of TiC à oxygen ions, and oxidation in a wet environment is performed in the form of the oxidation of TiC—à titanium dioxides (anatase), and then reacts with water ($H_2O$) to form Ti—OH. This reaction forms a path through which oxygen can penetrate into the particles, and may be provided to facilitate the movement of Ti4+ and O2− ions.

Suboxides, such as TiO, $Ti_2O_3$, and $Ti_3O_4$, are conductive suboxides. Suboxides can be controlled in dry oxidation. In wet oxidation, suboxides are formed almost simultaneously with surface titanium dioxides (anatase). Accordingly, when the surface oxide layer is thickened over time, a conduction phenomenon does not occur, and thus insulation characteristics may be implemented after painting.

Accordingly, according to one embodiment, oxidation is performed only up to the formation of suboxides during oxidation, thereby maintaining the conductivity of the non-oxide ceramic particles and preventing the additional oxidation of the particles during the use and storage of paint.

According to one embodiment, interstitial vacancies are allowed to penetrate the surfaces of the non-oxide ceramic particles by oxidizing the non-oxide ceramic particles at a temperature of 400° C. or lower, and thus dense oxidation protecting layers are formed, thereby maximally protecting the formation of an oxygen ion path into the non-oxide ceramic particles and also maintaining the intrinsic electrical conductivity of TiC by means of the formation of suboxides.

Furthermore, in one embodiment, the ratio of deionized water to total paint may affect the conductivity of the paint. More specifically, the higher the ratio of deionized water to total paint, the lower the conductivity of the paint. When the conductivity decreases, a paint film thickness reduction phenomenon occurs, so that it is difficult to place a paint film on the surface of a painting target to a predetermined paint film thickness or higher and also throw power is reduced, thereby causing a partially unpainted phenomenon. Furthermore, when the ratio of deionized water is extremely low, the conductivity is high, the appearance of the paint film may be rough or stains may occur. Accordingly, the appropriate conductivity is 800-2300 µS/cm, and may be preferably maintained between 1000 and 1700 µS/cm. Furthermore, when the conductivity of the paint is equal to or lower than 800, an unpainted phenomenon occurs on the inside of a connector, a bent portion, or the like. When the conductivity of the paint is equal to or higher than 2300, the appearance thereof may be rough and stains may occur. Accordingly, the ratio of deionized water to total paint may be set such that the paint has a conductivity of 800-2300 µS/cm, preferably 1000-1700 µS/cm.

Furthermore, when oxygen partial pressure exceeds 20 kPa, oxidation is performed simultaneously as in a wet environment, and thus a problem may arise in that it is difficult to control the oxidation control. Accordingly, heat treatment may be performed at a low oxygen partial pressure using an atmospheric pressure or an atmosphere furnace.

The oxygen partial pressure according to one embodiment may be 2 to 15 kPa, but is not limited thereto.

The heat treatment conditions according to one embodiment may be between 200 and 400° C., the heat treatment time may be within the range of 1 to 10 h, and the oxygen partial pressure may be between 2 to 20 kPa.

When the heat treatment temperature is lower than the above temperature, a long time is required to oxidize the surfaces. In contrast, when the heat treatment temperature is high, crystalline oxide layers may be formed on the surfaces thereof.

The paint composition according to one embodiment may be used as electro-deposition paint, but is not limited thereto and may be used for various purposes such as brush painting and dip painting. Furthermore, the paint composition may be applied to metals and metal coupling parts. For example, the paint composition may be applied to metals and metal coupling parts used in various fields such as the defense industry, home appliance, electronic device, telecommunication, and automobile fields. For example, the paint composition may be applied to the connectors and adapters of various fields.

The non-oxide ceramic particles according to one embodiment may be provided as particles having a zeta potential value between −50 and 50 mV in the range of pH 4 to 7, but are not limited thereto.

In the case where the paint composition according to the embodiment is used as electro-deposition paint, when the zeta potential value of the particles is large and the particles have a charge opposite to that of a binder resin, the binder resin and the particles aggregate with each other and a sedimentation phenomenon may occur. When the paint is charged with electricity, the non-oxide ceramic particles may move and attach to an electrode other than a painting target.

Furthermore, in the case where the zeta potential value of the paint composition according to the embodiment is large and the paint composition has the same charge as that of the binder resin, when they are charged, the components of the paint layer of the surface of a painting target are made non-uniform due to a difference between the moving speeds of the binder resin and the non-oxide ceramic particles, and thus local insulation characteristics may be generated.

In the formulation of the paint using the non-oxide particles, it may be necessary to exclude high-energy dispersion equipment that may damage the surfaces of the non-oxide ceramic particles and the binder resin.

Dispersion is performed in deionized water. In this case, when high energy is applied to the surfaces of the particles from the outside, for example, when a planetary mill, an attrition mill, or high-frequency ultrasonic waves are used, crystalline oxides are formed on the surfaces as the surfaces change, so that insulation characteristics may be exhibited and damage to the binder resin may occur, thereby causing a damage such as boiling on the surfaces after the drying of the paint. Accordingly, the paint should be formulated using a simple ball mill, an agitator, a homogenizer, a low-frequency ultrasonic wave disperser and the like without any change attributable to surface treatment or the like other than a wet phenomenon in the surfaces of the ceramic particles. After painting, the surface of the painting layer may be provided with weak force used to transmit electricity in a transverse direction in the painting layer, i.e., in a direction parallel to the painting layer. Furthermore, the absorption of some electromagnetic waves occurs inside the painting layer, and electromagnetic waves that are not absorbed may move through the surface metal layer.

Furthermore, according to an embodiment, a metal powder may be mixed to improve the electrical conductivity in the transverse direction of the painting layer.

FIG. 1 is a flowchart showing a method of producing a conductive paint composition according to one embodiment.

Referring to FIG. 1, the method of producing a conductive paint composition may include dispersion and wetting step S100, resin mixing step S110, and stirring and aging step S120.

In one embodiment, at dispersion and wetting step S100, there may be performed the step of dispersing and wetting oxide ceramic particles and non-oxide ceramic particles in deionized water by using a low-frequency ultrasonic cleaner, a ball mill, a paint shaker, an agitator, and/or the like.

In one embodiment, at resin mixing step S110, there may be performed the step of mixing a resin with the mixture of the ceramic particles and the deionized water formed at dispersing and wetting step S100.

For example, an epoxy resin, an acrylic resin, a urethane resin or the like may be provided as the resin. Furthermore, the ratio of the resin to the deionized water may be 1:2. As an example, the ratio of an epoxy solution to deionized water, the ratio of an acrylic solution to deionized water, and the ratio of urethane solution to deionized water may be 1:2.

In one embodiment, stirring and aging step S120 may be the step of performing stirring at room temperature.

For example, stirring and aging step S120 may be the step of putting a beaker in a low-frequency ultrasonic cleaner or the like and then performing stirring by applying external force.

Furthermore, according to one embodiment, the above-described conductive paint composition may further include a pigment used to implement color and/or a dispersant used to improve dispersion characteristics. Accordingly, the method of producing a conductive paint composition may further include the step of adding a pigment and/or the step of adding a dispersant.

Various examples and comparative examples of the paint composition will be described below.

TABLE 1

| Oxygen wt % | Immediately after production | After one week | After one month | After three months |
|---|---|---|---|---|
| Example 1 (TiC) | 1.5 | 1.5 | 1.7 | 1.9 |
| Comparative example 1 (TiC) | 0.5 | 1 | 1.5 | 3 |
| Example 1 ($Si_3N_4$) | 1.7 | 1.8 | 1.9 | 2.0 |
| Comparative example 1 ($Si_3N_4$) | 0.8 | 1.1 | 1.7 | 2.4 |

In example 1 of table 1, non-oxide ceramic particles were oxidized. More specifically, 100 g of TiC powder and 100 g of $Si_3N_4$ powder were each spread out on a 10 cm×10 cm aluminum foil, the foils were placed in an atmosphere furnace, gases, i.e., Ar and $O_2$ were introduced at the ratio of 80/20 kPa, and temperature was raised to 300° C. at a rate of 10° C./min and then maintained for 5 hours, thereby oxidizing non-oxide ceramic particles. Furthermore, in example 1, the non-oxide ceramic particles were dispersed. More specifically, 200 g of deionized water was introduced into each of two 500 ml beakers, g of oxidized TiC and 40 g of $Si_3N_4$ were mixed in the deionized water, and the beakers were placed in a low-frequency ultrasonic cleaner and were subjected to ultrasonic treatment for 30 minutes while being stirred at a speed of 300 rpm, thereby dispersing the non-oxide ceramic particles. Furthermore, in example 1, the composition subjected to ultrasonic treatment was immediately left for one week, one month, and three months, samples were taken therefrom and dried in a drying furnace at 150° C. for one hour, and then the oxygen contents of the samples were analyzed. The results of the analysis of the oxygen contents are shown in example 1 of table 1.

Furthermore, in comparative example 1 of table 1, with respect to TiC and $Si_3N_4$ particles, non-oxide ceramic particles were dispersed without oxidation, the dispersed composition was subjected to ultrasonic treatment, and the results of the analysis of the oxygen contents of the dispersed composition were shown. More specifically, in comparative example 1, 200 g of deionized water was introduced into each of two 500 ml beakers without TiC and $Si_3N_4$ particles being oxidized, 40 g of oxidized TiC and 40 g of Si3N4 were mixed in the deionized water, and the beakers were placed in a low-frequency ultrasonic cleaner, stirred at a speed of 300 rpm and subjected to ultrasonic treatment for 30 minutes, thereby dispersing the non-oxide ceramic particles. Furthermore, the composition subjected to ultrasonic treatment was immediately left for one week, one month, and three months, samples were taken therefrom and dried in a drying furnace at 150° C. for one hour, and then the oxygen contents of the samples were analyzed. The results of the analysis of the oxygen contents are shown in comparative example 1 of table 1.

TABLE 2

| Oxygen wt % | Immediately after production | 10 times | 100 times |
|---|---|---|---|
| Example 2 (TiC) | 1.5 | 1.5 | 1.5 |
| Comparative example 2 (TiC) | 0.5 | 0.7 | 1.3 |
| Example 2 ($Si_3N_4$) | 1.7 | 1.7 | 1.8 |
| Comparative example 2 ($Si_3N_4$) | 0.8 | 1.0 | 1.5 |

In example 2 of table 2, non-oxide ceramic particles were oxidized. More specifically, 100 g of TiC powder and 100 g of $Si_3N_4$ powder were each spread out on a 10 cm×10 cm aluminum foil, the foils were placed in an atmosphere furnace, gases, i.e., Ar and $O_2$ were introduced at the ratio of 80/20 kPa, and temperature was raised to 300° C. at a rate of 10° C./min and then maintained for 5 hours, thereby oxidizing non-oxide ceramic particles. Furthermore, in example 2, the non-oxide ceramic particles were dispersed. More specifically, 200 g of deionized water was introduced into each of two 500 ml beakers, g of oxidized TiC and 40 g of $Si_3N_4$ were mixed in the deionized water, and the beakers were placed in a low-frequency ultrasonic cleaner and were subjected to ultrasonic treatment for 30 minutes while being stirred at a speed of 300 rpm, thereby dispersing the non-oxide ceramic particles. Furthermore, in example 2, the composition subjected to ultrasonic treatment was charged with electricity tens of times, and the oxygen contents of the non-oxide ceramic particles in the composition were analyzed. Furthermore, the composition was stirred at a speed of 200 rpm by using magnetic stirrer. Electrodes were formed using aluminum plates at both ends of each of the beakers, and a voltage of 50V was applied for 1 minute through these electrodes. In example 2 of table 2, there are shown the results of the comparative analysis of the oxygen contents of the non-oxide ceramics in the composition after 10 charges and 100 charges.

In comparative example 2 of table 2, 200 g of deionized water was introduced into each of two 500 ml beakers, 40 g of oxidized TiC and 40 g of $Si_3N_4$ were mixed in the deionized water, and the beakers were placed in a low-frequency ultrasonic cleaner, stirred at a speed of 300 rpm and subjected to ultrasonic treatment for 30 minutes, thereby dispersing the non-oxide ceramic particles. In comparative example 2 of table 2, the composition subjected to ultrasonic treatment was subjected to experiments as in example 2, and the results of the analysis of oxygen contents were shown.

Figure 2:
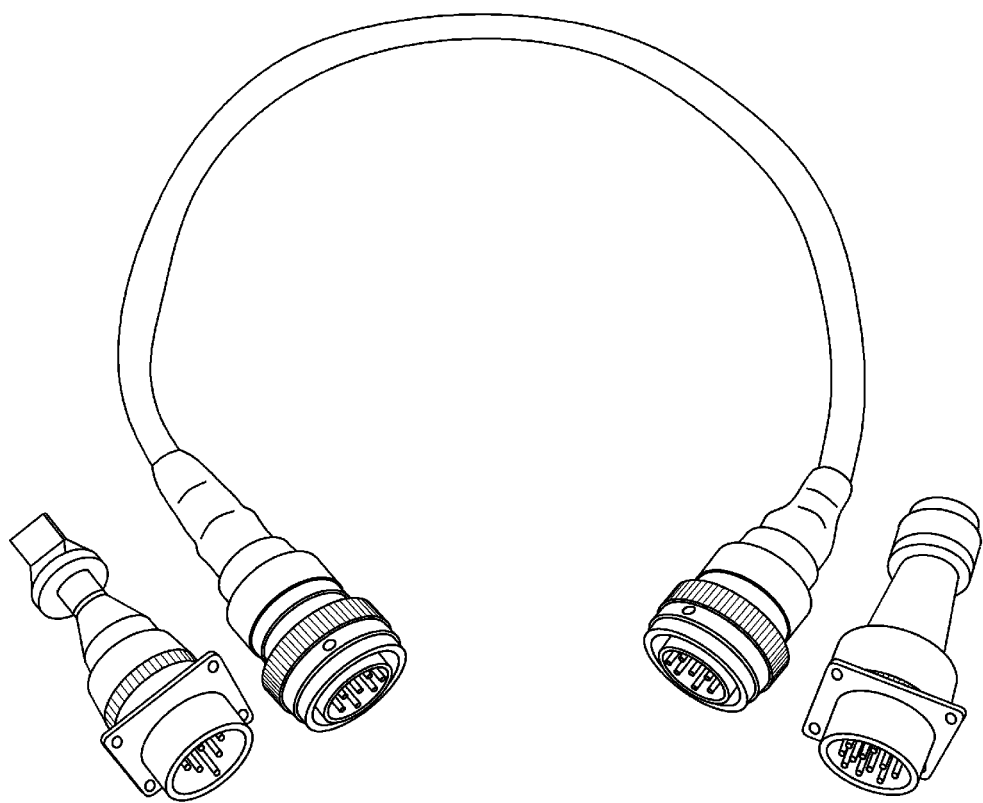
FIG. 2 is a view showing a connector according to example 3.

FIG. 2 is a view showing a connector according to example 3.

In example 3, 50 g of oxidized TiC and 300 g of deionized water were mixed in a beaker and dispersed at a frequency of kHz for 20 minutes by using a low-frequency ultrasonic cleaner, and 150 g of acrylic binder solution and 30 g of pigment were mixed and then dispersed in the same manner. Furthermore, the acrylic binder solution mixed with the pigment was introduced while the dispersed deionized water and TiC were being stirred using a stirrer, stirring was performed at a speed of 300 rpm for 20 minutes after the introduction, and electrodes were disposed on the wall surface of the beaker after the stirring. Furthermore, in example 3, the connector shown in FIG. 2 was fastened with a metal rack and then introduced into a stirring solution. Current was applied for 30 seconds under a voltage of 12.5 V with the wall surface of the beaker charged with positive charges and the metal lack charged with negative charges, and the painted connector was washed, dried in a drying furnace at 160° C. for 4 hours and then assembled.

Figure 3:
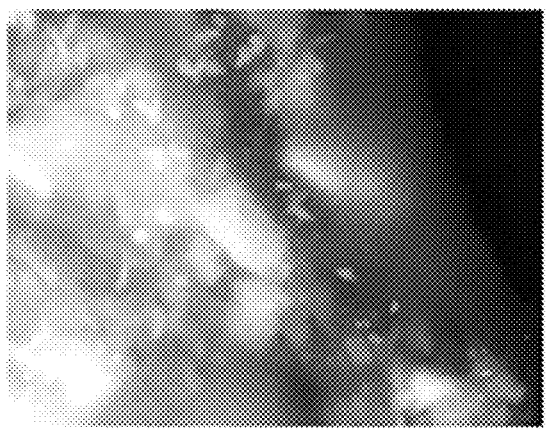
FIG. 3 shows SEM-EDS photos of the cross sections of the painting layer of the connector of example 3.
Figure 3:
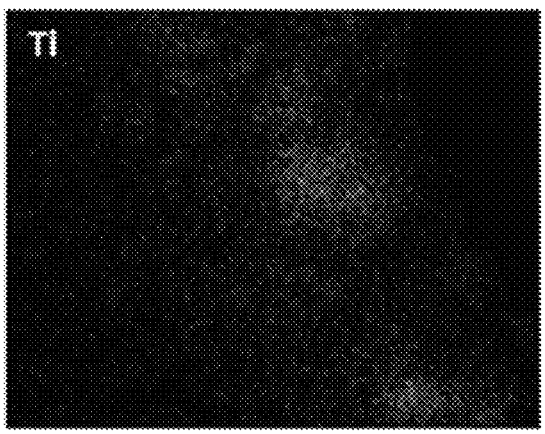
Figure 3:
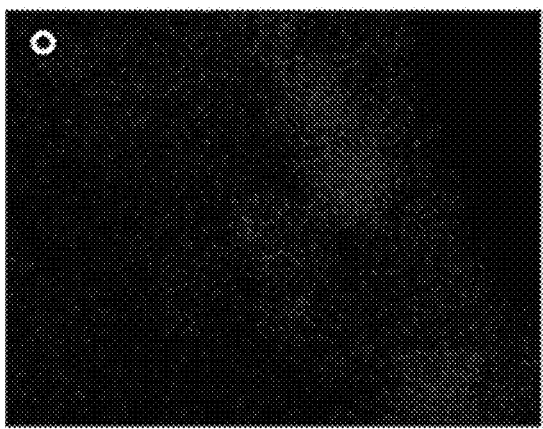
Figure 3:
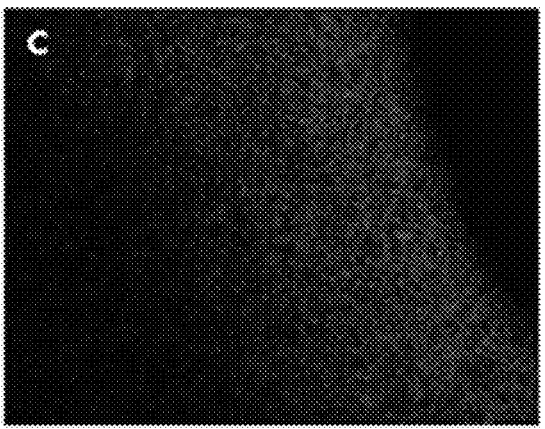

FIG. 3 shows SEM-EDS photos of the cross sections of the painting layer of the connector of example 3.

As shown in FIG. 3, in the SEM-EDS photos of the cross sections of the painting layer of the connector of example 3, the surfaces of TiC were oxidized because both Ti and O were detected in particles (white portions).

Figures 4A, 4B, 4C:
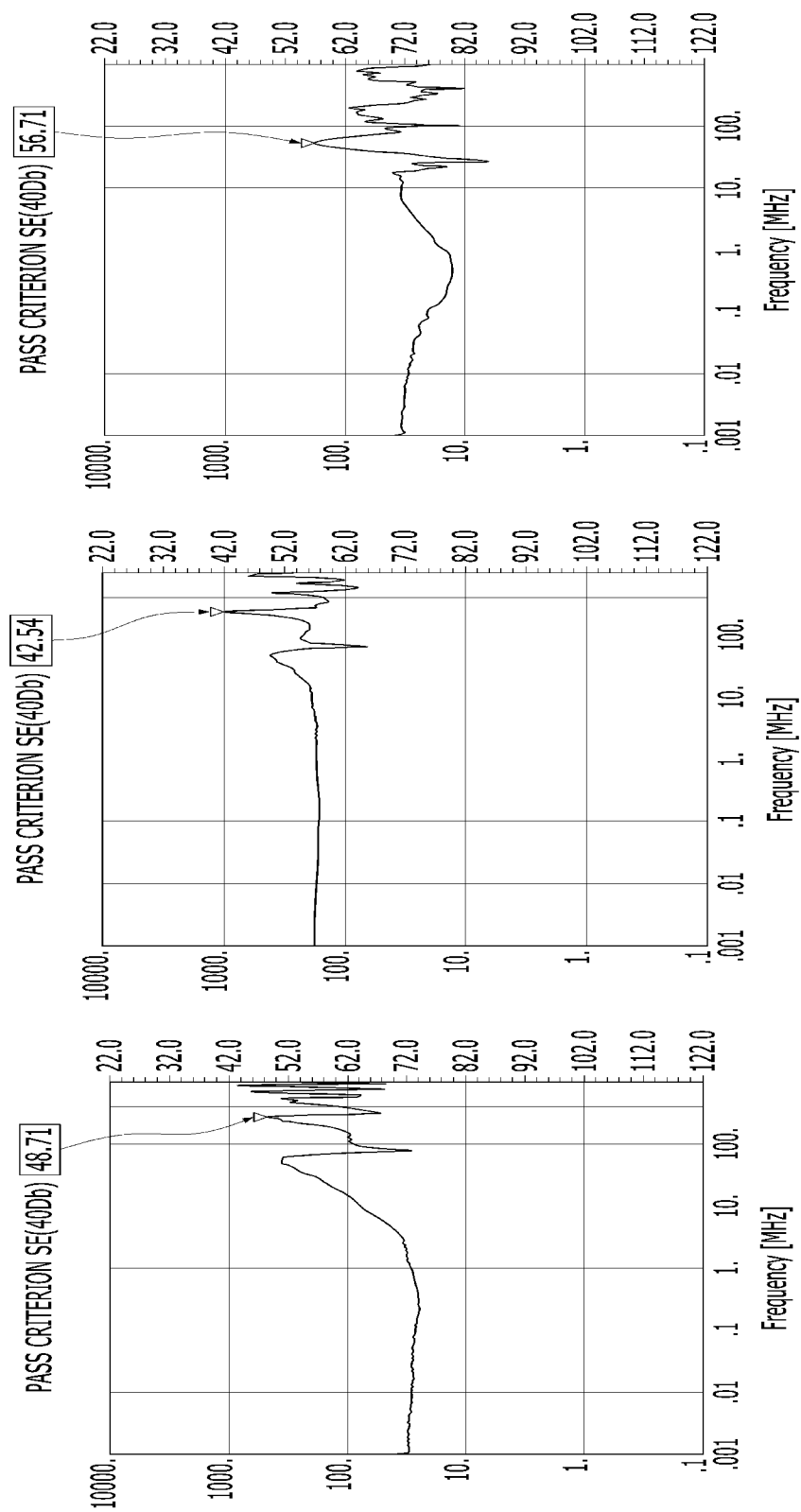
FIGS. 4A-4C are views showing the results of the comparative tests of shielding performance.

FIGS. 4A-4C are views showing the results of the comparative tests of shielding performance.

FIG. 4A shows test results of the shielding performance of example 3, FIG. 4B shows test results of the shielding performance of comparative example 3, and FIG. 4C show test results of the shielding performance of example 5.

A connector electrochemical plated using a cadmium plating process was assembled as a comparative sample for example 3 in comparative example 3, and was compared with the assembled connector of example 3 in terms of shielding performance.

As a result of the comparison, example 3 exhibited a reference shielding performance of 40 dB, and the lowest shielding performance was 48.71 dB, which was superior to 42.54 dB of the cadmium plated connector of comparative example 3. In particular, at a frequency of 10 MHz or lower, the shielding performance of the cadmium plating of comparative example 3 was lower than 60 dB while the connector of example 3 exhibited a performance of 70 dB.

In example 4, 50 g of oxidized TiC and 300 g of deionized water were mixed and introduced into a Nalgene bottle along with $ZrO_2$ balls and then stirring was performed at a speed of 200 rpm for 8 hours by using a ball mill, and 150 g of acrylic binder solution and 30 g of pigment were mixed and then stirring was performed for 4 hours in the same manner. Furthermore, the acrylic binder solution mixed with the pigment was introduced while the dispersed deionized water and TiC were being stirred using a stirrer, stirring was performed at a speed of 300 rpm for 20 minutes after the introduction, and electrodes were disposed on the wall surface of the beaker after the stirring. Furthermore, in example 3, the connector shown in FIG. 2 was fastened with a metal rack and then introduced into a stirring solution. Current was applied for 30 seconds under a voltage of 12.5 V with the wall surface of the beaker charged with positive charges and the metal lack charged with negative charges, and the painted connector was washed, dried in a drying furnace at 160° C. for 4 hours and then assembled. In this case, the shielding performance was 45.54 dB or higher.

In example 4-1, 50 g of oxidized TiC and 300 g of deionized water were mixed in a beaker and stirred at a speed of 5000 rpm for 2 hours by using a homogenizer (a high-speed stirrer), and 150 g of acrylic binder solution and 30 g of pigment were mixed and then stirred at a speed of 3000 rpm for 1 hour in the same manner. Furthermore, the acrylic binder solution mixed with the pigment was introduced while the dispersed deionized water and TiC were being stirred using a stirrer, stirring was performed at a speed of 300 rpm for 20 minutes after the introduction, and electrodes were disposed on the wall surface of the beaker after the stirring. Furthermore, in example 3, the connector shown in FIG. 2 was fastened with a metal rack and then introduced into a stirring solution. Current was applied for 30 seconds under a voltage of 12.5 V with the wall surface of the beaker charged with positive charges and the metal lack charged with negative charges, and the painted connector was washed, dried in a drying furnace at 160° C. for 4 hours and then assembled. In this case, the lowest shielding performance was 47.51 dB.

In example 5, 50 g of oxidized $Si_3N_4$ and 300 g of deionized water were mixed in a beaker and stirred at a frequency of 30 kHz for 20 minutes by using a low-frequency ultrasonic cleaner. 150 g of epoxy binder solution and 30 g of pigment were mixed and then dispersed in the same manner. The epoxy binder solution mixed with the pigment was introduced while the dispersed deionized water and $Si_3N_4$ were being stirred using a stirrer. After the introduction, stirring was performed at a speed of 300 rpm for 20 minutes. After the stirring, electrodes were disposed on the wall surface of the beaker. Furthermore, the connector was fastened with a metal rack and then introduced into a stirring solution. Current was applied for 30 seconds under a voltage of 12.5 V with the wall surface of the beaker charged with positive charges and the metal lack charged with negative charges. The painted connector was washed, dried in a drying furnace at 160° C. for 4 hours and then assembled. In this case, the shielding performance was 56 dB. Even in the 10 MHz low-frequency range, the shielding performance was 78 dB.

In example 6, 50 g of oxidized $Si_3N_4$ and 300 g of deionized water were mixed and introduced into a Nalgene bottle along with $ZrO_2$ balls and then stirring was performed at a speed of 200 rpm for 8 hours by using a ball mill, and 150 g of epoxy binder solution and 30 g of pigment were mixed and then dispersion was performed for 4 hours in the same manner. Furthermore, the epoxy binder solution mixed with the pigment was introduced while the dispersed deionized water and $Si_3N_4$ were being stirred using a stirrer. After the introduction, stirring was performed at a speed of 300 rpm for 20 minutes. After the stirring, electrodes were disposed on the wall surface of the beaker. Furthermore, the connector was fastened with a metal rack and then introduced into a stirring solution. Current was applied for 30 seconds under a voltage of 12.5 V with the wall surface of the beaker charged with positive charges and the metal lack charged with negative charges. The painted connector was washed, dried in a drying furnace at 160° C. for 4 hours and then assembled. In this case, the shielding performance was 49.54 dB or higher.

In example 6-1, 50 g of oxidized $Si_3N_4$ and 300 g of deionized water were mixed in a beaker and stirred at a speed of 5000 rpm for 2 hours by using a homogenizer (a high-speed stirrer), and 150 g of epoxy binder solution and 30 g of pigment were mixed and then stirred at a speed of 3000 rpm for hour in the same manner. Furthermore, the epoxy binder solution mixed with the pigment was introduced while the dispersed deionized water and $Si_3N_4$ were being stirred using a stirrer. After the introduction, stirring was performed at a speed of 300 rpm for 20 minutes. After the stirring, electrodes were disposed on the wall surface of the beaker. Furthermore, the connector was fastened with a metal rack and then introduced into a stirring solution. Current was applied for 30 seconds under a voltage of 12.5 V with the wall surface of the beaker charged with positive charges and the metal lack charged with negative charges, and the painted connector was washed, dried in a drying furnace at 160° C. for 4 hours and then assembled. In this case, the lowest shielding performance was 53.45 dB.

In example 7, 50 g of oxidized SiC and 300 g of deionized water were mixed in a beaker and dispersed at a frequency of 30 kHz for 20 minutes by using a low-frequency ultrasonic cleaner, and 150 g of epoxy binder solution and 30 g of pigment were mixed and then dispersed in the same manner. The urethane binder solution mixed with the pigment was introduced while the dispersed deionized water and TiC were being stirred using a stirrer, and stirring was performed at a speed of 300 rpm for 20 minutes after the introduction. After the stirring, electrodes were disposed on the wall surface of the beaker. Furthermore, the connector was fastened with a metal rack and then introduced into a stirring solution. Current was applied for 30 seconds under a voltage of 12.5 V with the wall surface of the beaker charged with positive charges and the metal lack charged with negative charges. The painted connector was washed, dried in a drying furnace at 160° C. for 4 hours and then assembled. In this case of example 7, the lowest shielding performance was 44.04 dB.

In example 8, 50 g of oxidized SiC and 300 g of deionized water were mixed and introduced into a Nalgene bottle along with $ZrO_2$ balls and then stirring was performed at a speed of 200 rpm for 8 hours by using a ball mill, and 150 g of urethane binder solution and 30 g of pigment were mixed and then dispersion was performed by performing stirring for 4 hours in the same manner. Furthermore, the urethane binder solution mixed with the pigment was introduced while the dispersed deionized water and TiC were being stirred using a stirrer, and then stirring was performed at a speed of 300 rpm for 20 minutes. After the stirring, electrodes were disposed on the wall surface of the beaker, and the connector was fastened with a metal rack and then introduced into a stirring solution. Current was applied for 30 seconds under a voltage of 12.5 V with the wall surface of the beaker charged with positive charges and the metal lack charged with negative charges. The painted connector was washed, dried in a drying furnace at 160° C. for 4 hours and then assembled. In example 8, the shielding performance was 42.54 dB.

In example 8-1, 50 g of oxidized SiC and 300 g of deionized water were mixed in a beaker and dispersed at a speed of 5000 rpm for 2 hours by using a homogenizer (a high-speed stirrer). 150 g of urethane binder solution and 30 g of pigment were mixed and then stirred at a speed of 3000 rpm for 1 hour in the same manner. Furthermore, the urethane binder solution mixed with the pigment was introduced while the dispersed deionized water and TiC were being stirred using a stirrer, and then stirring was performed at a speed of 300 rpm for 20 minutes. After the stirring, electrodes were disposed on the wall surface of the beaker, and the connector was fastened with a metal rack and then introduced into a stirring solution. Current was applied for 30 seconds under a voltage of 12.5 V with the wall surface of the beaker charged with positive charges and the metal lack charged with negative charges, and the painted connector was washed, dried in a drying furnace at 160° C. for 4 hours and then assembled. In this case, the lowest shielding performance was 42.83 dB.

Figure 5:
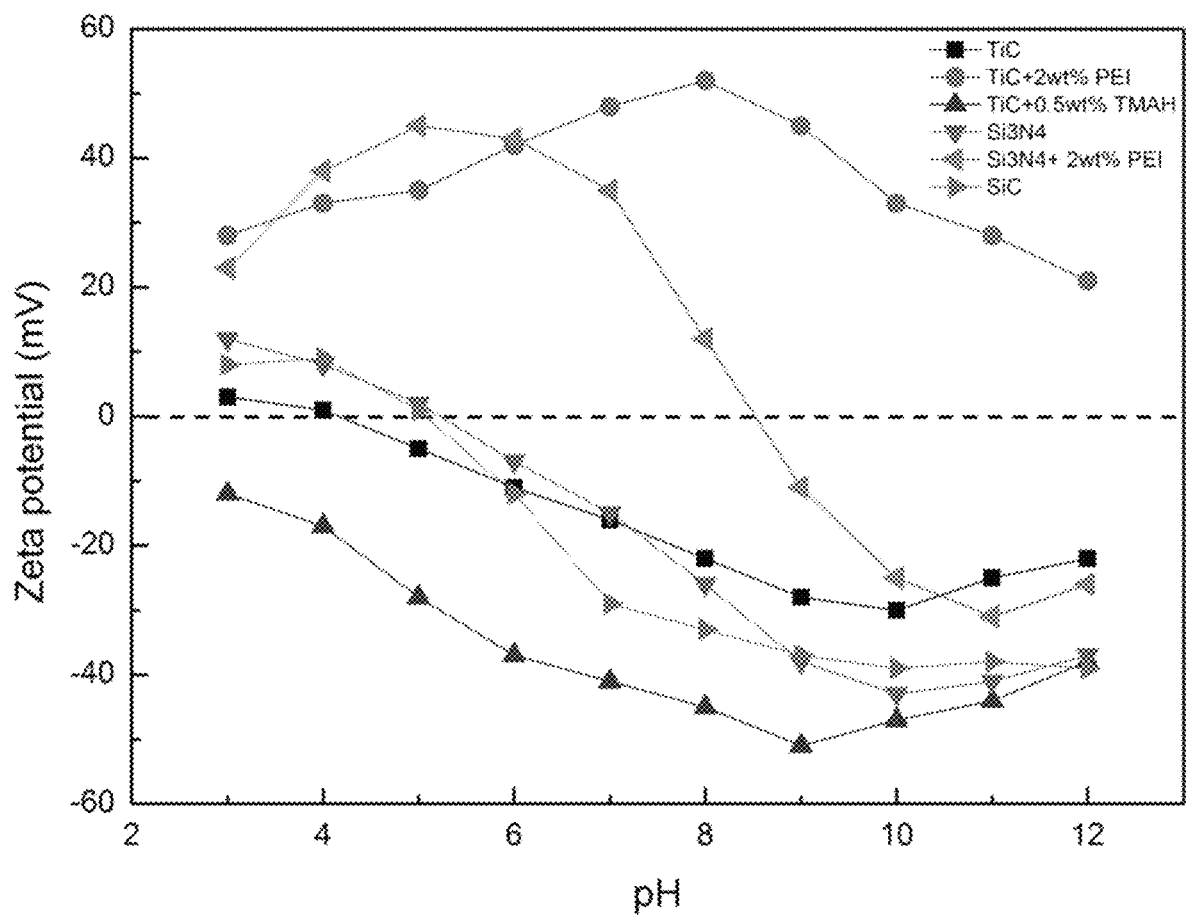
FIG. 5 is a graph showing the zeta potentials of comparative examples.

FIG. 5 is a graph showing the zeta potentials of the comparative examples.

Referring to FIG. 5, in comparative example 4, 50 g of TiC, 300 g of deionized water and 1 g of polyethylene imine (PEI; molecular weight: 100000) were mixed in a beaker, the zeta potential of TiC was increased from −5 mV to 38 mV, and paint was produced at pH 6 in the same manner as in example 3 and applied to a connector. Stains were partially generated, and painted surfaces exhibiting insulation characteristics depending on their location were identified.

In comparative example 5, 50 g of TiC, 300 g of deionized water, and 0.5 g of tetramethylammonium hydroxide (TMAH) were mixed in a beaker, the zeta potential of TiC was increased from −5 mV to −25 mV, and paint was produced at pH 6 in the same manner as in example 3. As time elapsed, aggregation rapidly occurred inside the paint, which caused sediment. When a connector was painted, the painted surface swelled like a sponge. This is considered to have sunk due to aggregation with the acrylic binder solution.

In comparative example 6, 50 g of $Si_3N_4$, 300 g of deionized water and 1 g of PEI (molecular weight: 100000) were mixed in a beaker, the zeta potential of TiC was increased from −5 mV to 38 mV, and paint was produced at pH 6 in the same manner as in example 3 and applied to a connector. In the same manner as in example 4, stains were partially generated, and painted surfaces exhibiting insulation characteristics depending on their location were identified. When comparative examples 4 to 6 and FIGS. 4A-4C were compared, in the case where the zeta potential value of the ceramic particles was equal to or higher than 30 mV within the range of pH 5.5 to pH 6.5, which is the appropriate pH range of electro-deposition painting, when paint is charged with electricity to perform electro-deposition painting, the binder solution and the ceramic particles moved individually, and thus the uniform painting of the ceramic particles was not achieved, so that there were portions with and without ceramic particles on a painted surface, with the result that local stains and insulation characteristics might be generated. In contrast, in the case where the zeta potential value was equal to or lower than 30 mV, when paint was charged with electricity, the electrophoretic phenomenon of the ceramic particles themselves was insignificant, so that the ceramic particles moved along with the binder of the binder solution, and thus ceramic particles could be uniformly distributed on a painted surface without damaging dispersion characteristics. When the ceramic particles had a zeta potential value opposite to that of the binder solution and the value was larger than 30 mV (TiC+TMAH in comparative example 5), the ceramic particles might aggregate with the binder and sediment might be formed.

In comparative example 7, 50 g of TiC and 300 g of deionized water were mixed and pulverized for 2 hours by using an attrition mill. After the pulverization, an average particle size might be reduced to 1 μm or lower. Paint was produced in the same manner as in example 3 (using an epoxy binder) and applied to a connector, and the conductivity thereof was measured. The conductivity exhibited insulation characteristics. The reason for this is that TiC was pulverized during milling and the non-oxidized new surfaces of TiC were rapidly oxidized with deionized water.

In comparative example 8, production was performed using TiC boiled in deionized water for 6 hours by the method of example 3. As a result of measuring the conductivity of comparative example 8, a phenomenon in which current was not applied due to insulation attributable to the oxidized layer of the surface might occur.

In comparative example 9, pH was adjusted to 5.3 by using acetic acid, and then the connector was painted by the method of example 3. As a result, a phenomenon that was not painted occurred.

Comparative example 10 shows results obtained by adjusting pH to 7 by using ammonia water and producing paint by using the method of example 3. As a result of comparative example 10, a strong aggregation phenomenon and a strong sedimentation phenomenon occurred within the paint. This may indicate that the aggregation of the epoxy binder occurred in an alkali state.

Figure 6A:
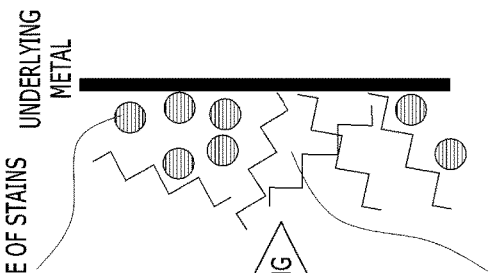
FIGS. 6A-6C are views showing changes inside paint based on zeta potential values.
Figure 6B:
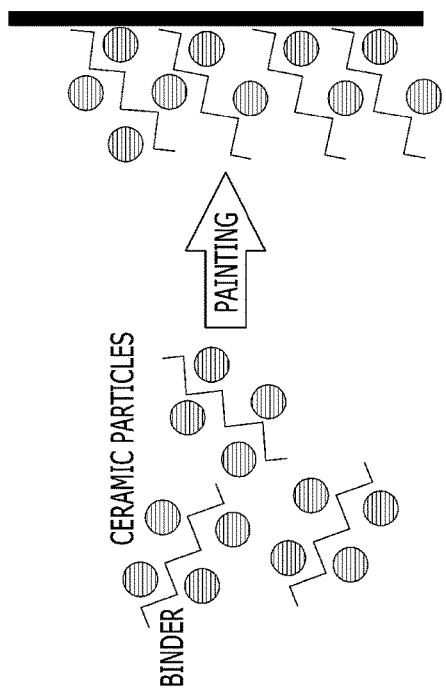
Figure 6C:
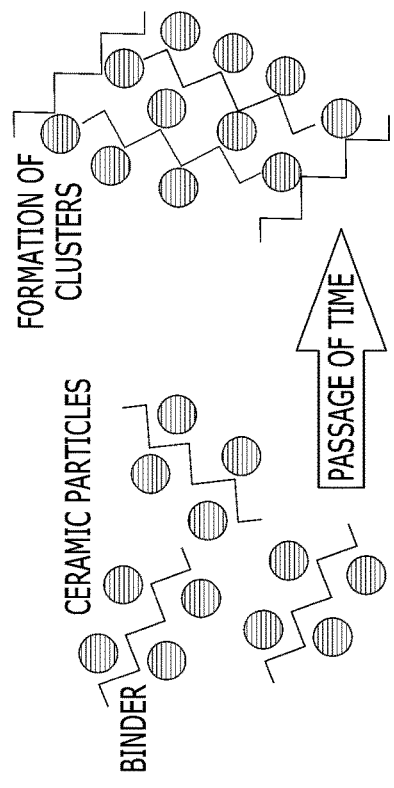

FIGS. 6A-6C are views showing changes inside paint based on zeta potential values.

Referring to FIGS. 6A-6C, as shown in the preceding examples and comparative examples, when the zeta potential value of the ceramic particles ranges from −30 mV to 30 mV, preferred painting and insulation characteristics may be achieved, as shown in FIG. 6A. Furthermore, when the zeta potential value of the ceramic particles is equal to or higher than 30 mV or is equal to or lower than −30 mV and of the ceramic particles have the same basic charge as the binder solution, insulation characteristics are exhibited, but stains may occur, as shown in FIG. 6B. Moreover, when the zeta potential value of the ceramic particles is equal to or higher than 30 mV or is equal to or lower than −30 mV and of the ceramic particles have a basic charge opposite to that of the binder solution, clusters may be formed over time, as shown in FIG. 6C.

Figure 7:
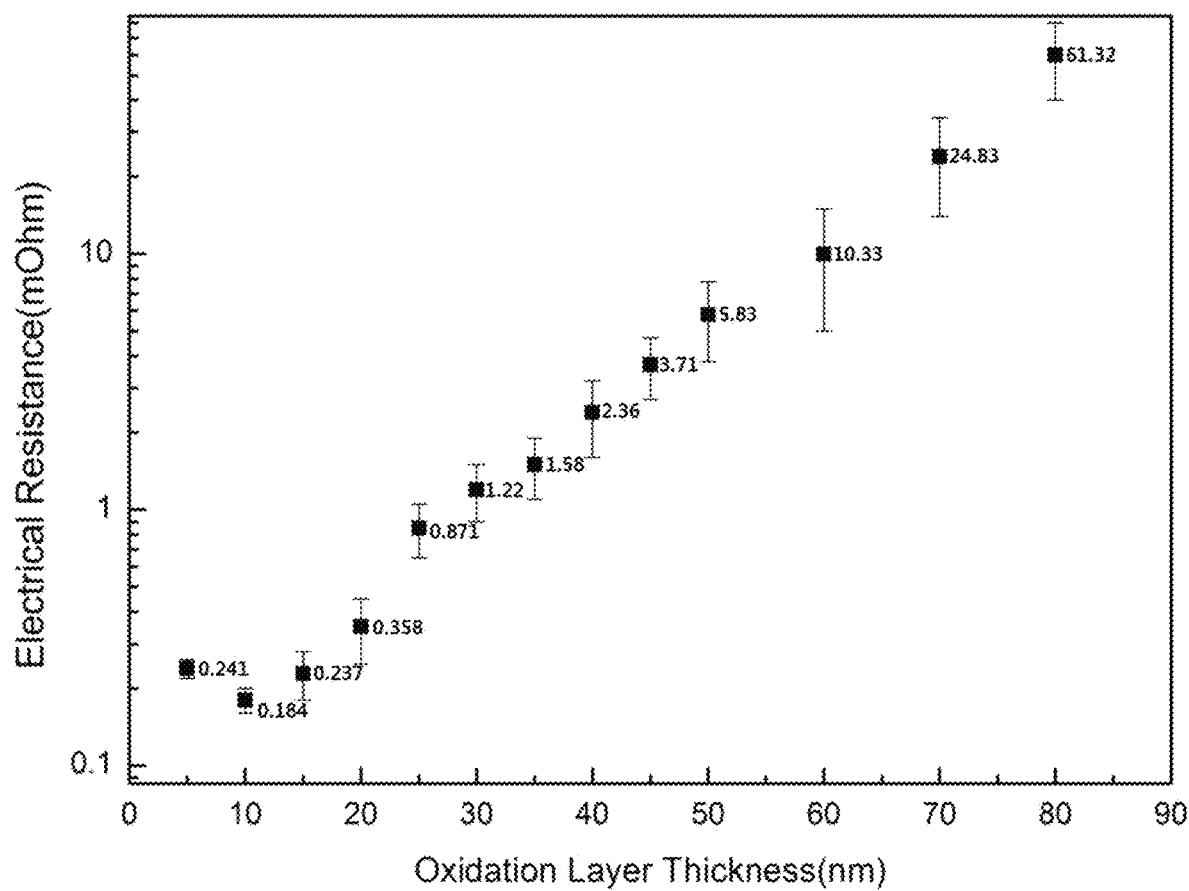
FIG. 7 is a graph showing low resistance characteristics according to the thickness of the oxide layer of paint.

FIG. 7 is a graph showing low resistance characteristics according to the thickness of the oxide layer of paint.

Referring to FIG. 7, the graph of FIG. 7 shows low resistance characteristics according to the thickness of the oxide layer of $Si_3N_4$. More specifically, the graph of FIG. 7 shows results obtained by painting a connector part by using Si3N4 oxidized to various thicknesses by means of the method of example 5, assembling the connector and measuring the low resistance values of both ends of the connector. The thickness of each oxide layer was calculated using the results of the analysis of the oxygen content and radius of curvature of the particles. As a result of the test, the low resistance value increased rapidly from the case where the thickness of the oxide layer was 50 nm or larger, and the insulation characteristics were exhibited when the oxide layer was 90 nm or larger in thickness. Furthermore, when the thickness of the oxide layer ranged from 50 to 80 nm, a resistance value was high, and thus it may be difficult to use the oxide layer for conductive painting. Accordingly, the paint preferably has a thickness of an oxide layer of 50 nm or lower, and more preferably, the paint may have an oxide layer thickness of 20 nm or lower.

Figure 8:
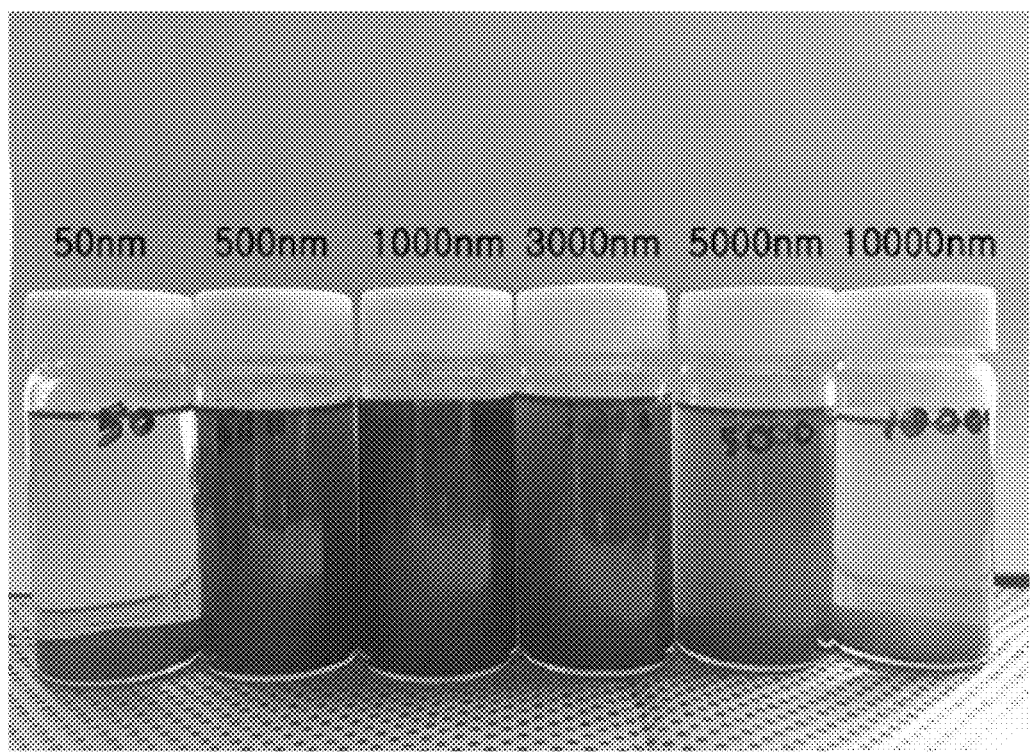
FIG. 8 shows views illustrating dispersion capability according to the size of non-oxide ceramic particles.

FIG. 8 shows views illustrating dispersion capability according to the size of non-oxide ceramic particles.

Referring to FIG. 8, the photos of FIG. 8 show the degrees of sedimentation of particles over time measured after TiC particles having various sizes were mixed with deionized water and dispersed using ultrasonic waves for 20 minutes. As shown in FIG. 8, most of 50 nm and 10,000 nm particles were settled after 3 hours.

It is difficult to disperse the particles having a size equal to or smaller than 100 nm. Even when they are dispersed, they easily aggregate again because surface energy is high. Furthermore, when the size of the particles is equal to or larger than 10000 nm, a sedimentation phenomenon occurs easily due to the weight of the particles, and it may be difficult to keep the particles dispersed. Accordingly, the preferred particle size may be between 100 and 10000 nm, and more preferably between 500 and 5000 nm.

According to one embodiment, the physically and chemically stable conductive paint composition may be provided.

The effects of the present invention are not limited to the above-described effects, and other effects that are not described herein will become apparent to those having ordinary skill in the art to which the present invention pertains from the present specification and the accompanying drawings.

While the configuration and features of the present invention have been described based on the embodiments according to the present invention, the present invention is not limited thereto. It will be apparent to those having ordinary skill in the art to which the present invention pertains that various modifications or alterations may be made within the spirit and scope of the present invention. Accordingly, it is noted that such modifications and alterations fall within the scope of the attached claims.

What is claimed is:

1. Conductive paint for electro-deposition painting, the paint comprising:
   a resin;
   deionized water; and
   non-oxide ceramic particles each configured such that an oxide layer comprising a non-metal oxide material is provided on a surface thereof, wherein the non-oxide ceramic particles comprise at least one of SiC, TiC and $Si_3N_4$ particles, and optionally, one or more $J_xQ_y$-form particles, where J and Q are elements selected from the group consisting of transition metals, C, B, N and Si; and a sum of x and y is 7 or less,
   wherein a thickness of the oxide layer ranges from 0.1 to 50 nm,
   wherein a diameter of the non-oxide ceramic particles ranges from 100 to 10,000 nm, and
   wherein the non-oxide ceramic particles are provided in a range of 2 to 25 wt % of the conductive paint, the resin is provided in a range of 10 to 40 wt % of the conductive paint, and the deionized water is provided in a range of 50 to 88 wt % of the conductive paint.

2. The conductive paint of claim 1, further comprising oxide ceramic particles.

3. The conductive paint of claim 1, wherein the resin comprises at least one of epoxy, acrylic and urethane resins.

4. The conductive paint of claim 1, wherein the non-oxide ceramic particles are provided in a range of 7 to 17 wt % of the conductive paint, the resin is provided in a range of 15 to 30 wt % of the conductive paint, and the deionized water is provided in a range of 55 to 75 wt % of the conductive paint.

5. The conductive paint of claim 1, wherein pH of the conductive paint ranges from 5.5 to 6.5.

6. The conductive paint of claim 2, wherein the oxide ceramic particles are provided in an amount of 0 to 100% by weight relative to the non-oxide ceramic particles.

7. The conductive paint of claim 1, further comprising a pigment used for implementation of color.

8. The conductive paint of claim 1, further comprising a dispersant used for improvement of dispersion characteristics.

9. The conductive paint of claim 1, wherein a ratio between the conductive paint and the deionized water is set such that a conductivity of the conductive paint is 800-2300 µS/cm.

* * * * *